United States Patent

[11] 3,586,886

[72] Inventors Kosei Nomiya
Tokyo;
Hazime Tsugihashi, Kodaira-shi, both of,
Japan
[21] Appl. No. 755,859
[22] Filed Aug. 28, 1968
[45] Patented June 22, 1971
[73] Assignee Hitachi, Ltd.
Tokyo, Japan
[32] Priority Sept. 1, 1967
[33] Japan
[31] 42/55800

[54] FLIP-FLOP CIRCUIT HAVING CHARGE STORAGE MEANS CONNECTED THERETO

6 Claims, 7 Drawing Figs.

[52] U.S. Cl. 307/281, 307/291, 307/292, 307/300

[51] Int. Cl. H03k 3/12

[50] Field of Search 307/208, 279, 281, 289, 291, 292, 300; 328/200, 206

[56] References Cited

UNITED STATES PATENTS

| | | | |
|---|---|---|---|
| 2,976,432 | 3/1961 | Geckle, Jr. | 328/200 X |
| 3,317,750 | 5/1967 | Narud et al. | 307/291 |
| 3,446,989 | 5/1969 | Allen et al. | 307/291 X |

*Primary Examiner*—Stanley D. Miller, Jr.
*Attorneys*—Craig and Antonelli and Stewart & Hill

ABSTRACT: A flip-flop circuit in which the input and output terminals of two transistorized switching stages are cross-coupled mutually through the emitter-base junctions of a pair of transistors and a trigger input signal is commonly applied to the collectors of said pair of transistors, through a pair of carrier storage diodes.

INVENTORS
KOSEI NOMIYA
HAZIME TSUGIHASHI

BY Craig & Antonelli
ATTORNEYS

INVENTORS
KOSEI NOMIYA
HAZIME TSUGIHASHI
BY
Craig & Antonelli
ATTORNEYS

FLIP-FLOP CIRCUIT HAVING CHARGE STORAGE MEANS CONNECTED THERETO

This invention relates to a flip-flop circuit using transistors.

Generally, a triggering circuit driving flip-flop circuits employs a differentiation circuit consisting of high capacity condensers (e.g. 500 pf.).

However, in the field of semiconductor integrated circuit technique it is difficult to make such a high capacity condenser, and hence to integrate a flip-flop circuit including the triggering circuit in one semiconductor substrate.

One object of this invention is to provide a flip-flop circuit particularly suitable to a semiconductor integrated circuit means using no high capacity condenser while decreasing the number of circuit elements.

Another object of this invention is to provide an improved flip-flop circuit obtaining an output voltage nearly equal to the power source voltage.

According to one embodiment of this invention, there is provided a flip-flop circuit in which the input and output terminals of two switching stages consisting of transistors and their load impedance means are crosswise coupled mutually through the emitter-base junctions of a pair of transistors, and a trigger input signal is applied to the collectors of the pair of transistors in common through a pair of charge storage means such as diodes having a large carrier storage effect and/or condensers of low capacitance.

The flip-flop circuit according to the above embodiment including the triggering circuit can be composed basically of four transistors, two PN junction diodes and two resistors, without using any high capacity condenser which is difficult to produce by the integration technique.

Explanation of this invention will be made hereinafter with reference to the accompanying drawings, in which.

Figure 1:
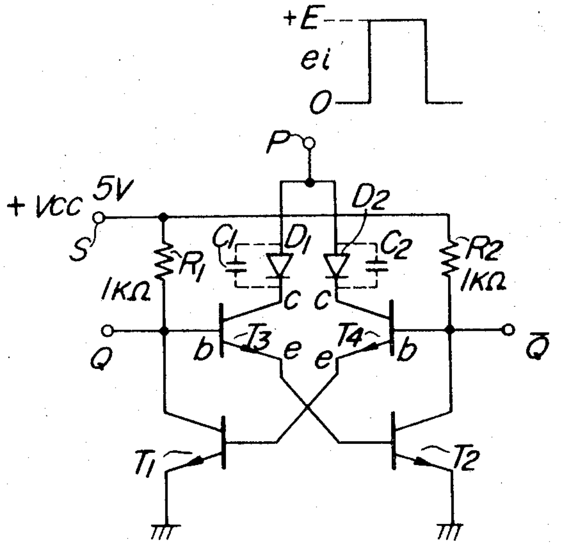
FIGS. 1 and 2 are circuit diagrams of flip-flop circuits according to embodiments of this invention.

In FIG. 1, $T_1$, $T_2$, $T_3$ and $T_4$ are high-speed switching transistors having a short recovery time. $R_1$ and $R_2$ are load resistors connected to the collectors of the transistors $T_1$ and $T_2$ respectively, their resistances being e.g. 1 KΩ. $D_1$ and $D_2$ are semiconductor diodes having the minority carrier storage effect.

To the power source terminal S is given an electric potential $+Vcc$, about 5V, and the trigger input terminal P receives a trigger pulse $e_i$. The output of the flip-flop circuit is derived from the terminals Q or $\overline{Q}$.

As is well-known, when a semiconductor diode given a forward bias and maintaining the conducting state is suddenly given zero bias, the minority carriers existing in the P or N regions of the diode do not vanish at once but remain as storage charges and contribute to the reverse current of the PN junction. This phenomenon is the so-called minority carrier storage effect. The storage charges increase in proportion to the forward current of the PN junction.

In this invention it is necessary that the diodes $D_1$ and $D_2$ have the storage effect. Further, it should be noted that the carrier storage in the diodes $D_1$ and $D_2$ are preferably so defined as to be larger than that in transistors $T_1$, $T_2$, $T_3$ and $T_4$, though this is not so critical.

Figures 3A, 3B, 3C, 3D:
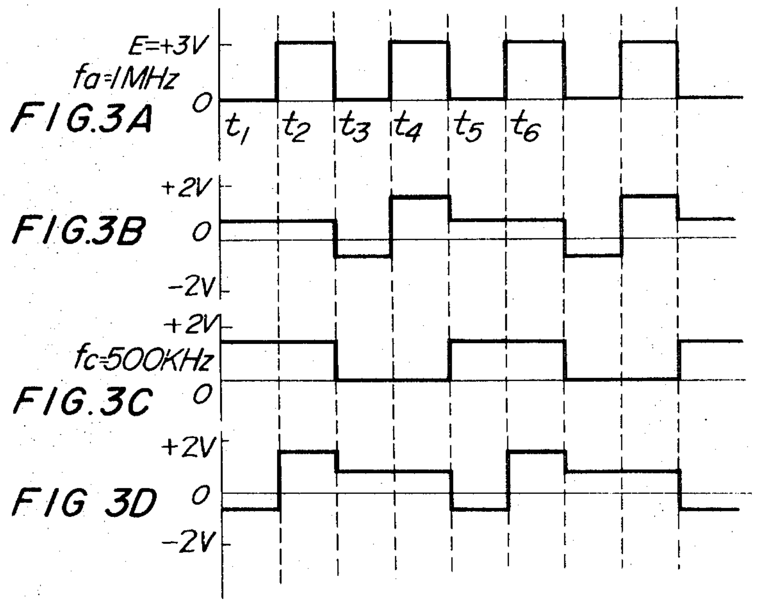
FIGS. 3A to 3D show the waveforms in various parts of the flip-flop circuit shown in FIG. 1.

Explanation of the operation manner of the flip-flop circuit according to one embodiment of this invention shown in FIG. 1 will be made hereinafter with reference to the voltage waveforms shown in FIGS. 3A to 3D, in which FIG. 3A shows the trigger pulse $e_i$, FIG. 3B shows the waveform at the collector $c$ of transistor $T_3$, FIG. 3C that at the output terminal Q and 3D that at the collector $c$ of transistor $T_4$.

Assume that at first the transistors $T_1$ and $T_2$ are on and off respectively. Between the time $t_1$ and $t_2$ the trigger pulse $e_i$ keeps the earth potential (0 level). In this case, the base current of the transistor $T_1$ is supplied from the power source having the potential $+Vcc$ through the resistor $R_2$ and the base-emitter path of transistor $T_4$. Therefore, the flip-flop circuit between $t_1$ and $t_2$ maintains the state in which $T_1$ is on while $T_2$ is off. When a trigger pulse $e_i$ having a voltage amplitude E is applied between the time $t_2$ and $t_3$, the collectors $c$ of transistors $T_3$ and $T_4$ are supplied with the voltage E. So, the collector current of transistor $T_4$ flows through the diode $D_2$ and acts to maintain the state in which $T_1$ is on. As the transistors $T_3$ and $T_2$ are off, there is no collector current flowing through the diode $D_1$. Therefore, between the time $t_2$ and $t_3$ the flip-flop circuit maintains the initial state (i.e. $T_1$ is on and $T_2$ is off).

When the trigger pulse $e_i$ recovers to the 0 level at $t_3$, the diode $D_1$ maintains the cutoff state whereas the diode $D_2$ changes from on to off state. Since the collector current of transistor $T_4$ has accumulated charges in the diode $D_2$, the base current of transistor $T_4$ flows towards the diode $D_2$ through the collector thereby to make the storage charges in the diode $D_2$ vanish rather than flows towards the emitter. As the transistor $T_4$ does not supply the base current to the transistor $T_1$, $T_1$ becomes off. As soon as the transistor $T_1$ is off, the base current is supplied to the transistor $T_2$ through the base-emitter path of the transistor $T_3$. So, the transistor $T_2$ becomes on. Thus, at the time $t_3$ when the supply of the trigger pulse $e_i$ ends, the transistor $T_1$ reverses its state from on to off while the transistor $T_2$ from off to on.

Next, when at the time $t_4$ the trigger pulse $e_i$ is again applied at the input terminal P, the collector current of the transistor $T_3$ flows through the diode $D_1$. In a similar way the base current of the transistor $T_2$ continues to flow and maintains the state in which $T_1$ is off while $T_2$ is on. At the time $t_5$ when the trigger pulse falls to the 0 level the transistors $T_1$ and $T_2$ become on and off respectively. Namely, they recover to the initial state.

Thus, it is possible to reverse the state of a flip-flop circuit successively by applying the trigger pulse $e_i$ at the terminal P. An input signal having a frequency $f_a$ as shown in FIG. 3A is converted to an output signal having a frequency $f_c$ = one-half $f_a$ at the output terminal Q.

As is evident from the foregoing explanation, the triggering of this invention is attained by a combination of a pair of diodes ($D_1$ and $D_2$) and a pair of transistors ($T_3$ and $T_4$) without necessitating any differentiation circuit using high capacitance condensers.

It is required in this invention to prepare charge storage means like the diodes $D_1$ and $D_2$, so it is permissible to connect condensers $C_1$ and $C_2$ instead of or in parallel with these diodes as shown in FIG. 1. The capacitances of these condensers may be small, in the range of 10 picofarads (pf.) or less so that the flip-flop circuit can be formed by the conventional semiconductor integrated circuit technique. It is needless to say that a plurality of diodes may be connected in parallel with each of the diodes $D_1$ and $D_2$.

Figure 2:
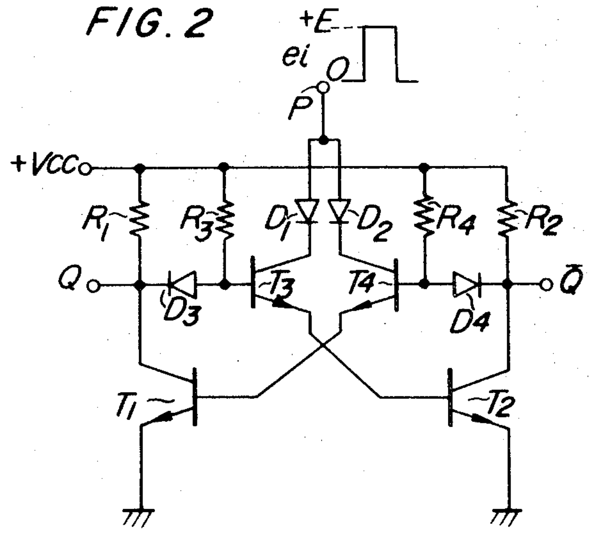

FIG. 2 shows another embodiment of this invention, which differs from that of FIG. 1 in that resistors $R_3$ and $R_4$ and diodes $D_3$ and $D_4$ are further added. In this case, it is preferably that the diodes $D_3$ and $D_4$ have substantially no storage effect.

In this circuit arrangement, the off level of the output terminal Q or $\overline{Q}$ can be increased. Assume first that the transistor $T_2$ is off while the transistor $T_1$ is on. Since the diode $D_4$ is biased in the cutoff state, the output at $\overline{Q}$ can be substantially equal to the power source voltage $+Vcc$. The diode $D_3$ is in the conducting state as the transistor $T_1$ is on and acts to supply no base current to the transistor $T_3$.

When a trigger pulse is applied to the terminal P, the flip-flop state is reversed in a similar to FIG. 1.

As is understood from the foregoing description, this invention can yield a flip-flop circuit capable of triggering with the use of a pair of transistors and a pair of diodes having the storage effect. This flip-flop circuit is suitable for integration in a semiconductor substrate. In the above two embodiments, circuits with a plurality of NPN transistors have been disclosed. In the case of integration the influence of the channel effect and the selection of the impurity to be used present no serious problems. Therefore, the circuits can be manufactured more easily than those with PNP transistors.

Figure 4:
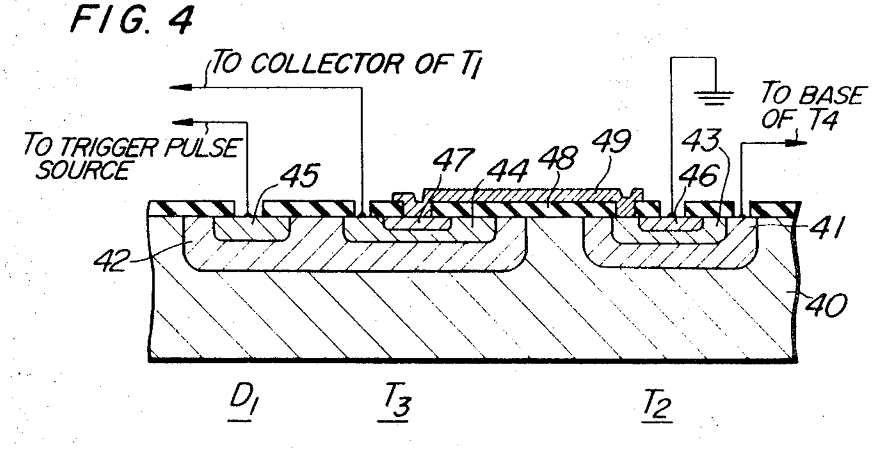
FIG. 4 is a partial sectional view of a circuit means integrating the circuit shown in FIG. 1 in accordance with one example of this invention.

Next, the semiconductor integrated circuit shown in FIG. 1 will be explained referring to FIG. 4. A set of diode $D_1$ and NPN transistor $T_3$ and an NPN transistor $T_2$ are formed respectively in the first and second electrically isolated regions formed in one principal surface of a semiconductor substrate 40 of first conductivity type e.g. P-type silicon. The substrate 40 contains third and fourth isolated regions having a set of diode $D_2$ and transistor $T_4$ and a transistor $T_1$ respectively. The set of diode $D_1$ and transistor $T_3$ form a pair with the set of diode $D_2$ and transistor $T_4$, and the transistor $T_2$ with the transistor $T_1$. Although the substrate further contains fifth and sixth isolated regions having resistors $R_1$ and $R_2$, they are omitted for simplicity's sake. The NPN transistor $T_2$ consists of an N-type collector region 41, a P-type base region 43 and an N-type emitter region 46. The emitter region 46 is led to a fixed potential such as the earth potential and the collector region 41 is led to the base region of the NPN transistor $T_4$. The NPN transistor $T_3$ consists of an N-type collector region 42, a P-type base region 44, and an N-type emitter region 47. The emitter region 47 is connected to the base region 43 of the transistor $T_2$ by means of an interconnecting layer 49 extending over an insulating film 48 of silicon oxide, etc. covering the surface of substrate 40. The base region 44 is led to the collector region of transistor $T_1$. The diode $D_1$ is composed of the N-type collector region 42 of transistor $T_3$ and a P-type anode region 45 formed therein. This anode region is led to a trigger pulse source.

The above-mentioned integrated device can be manufactured simply through the use of diffusion technique. In the embodiment shown in FIG. 4 the electrical isolation of the transistor $T_3$ and the diode $D_1$ from the transistor $T_2$ is made by the PN junction formed between the substrate 40 and the collector region 42. It is needless to say that if necessary other isolation methods such as dielectric isolation may be used.

The few embodiments of this invention described hereinabove are merely illustrative. Minute modifications may be made easily by those skilled in the art without departing from the appended claims.

What we claim is:

1. A flip-flop circuit comprising:

a first switching stage including a first transistor, a first load impedance means and a first output terminal, said first load impedance means and said first output terminal being connected to the collector of said first transistor;

a second switching stage including a second transistor, a second load impedance means and a second output terminal, said second load impedance means and said second output terminal being connected to the collector of said second transistor;

a third transistor whose emitter and base are connected to the base of said second transistor and said first output terminal respectively by first and second conducting means;

a fourth transistor whose emitter and base are connected to the base of said first transistor and second output terminal respectively by third and fourth conducting means; and first and second charge storage means connected respectively to the collectors of said third and fourth transistors for applying a common trigger signal to each of the collectors of said third and fourth transistors.

2. A flip-flop circuit according to claim 1, wherein said first and second charge storage means are constituted by first and second diodes having the minority carrier storage effect and connected respectively to the collectors of said third and fourth transistors in the direction of conduction of the collector currents so that a common trigger signal may be applied to each of the collectors of said third and fourth transistors.

3. A flip-flop circuit according to claim 2, wherein said first to fourth transistors are NPN transistors.

4. A flip-flop circuit according to claim 2, wherein said first and second diodes are connected in parallel with condensers having a capacitance in the range of 10 picofarads.

5. A flip-flop circuit comprising:

a first switching stage including a first transistor, a first load impedance means, and a first output terminal, said first load impedance means and said first output terminal being connected to the collector of said first transistor;

a second switching stage including a second transistor, a second load impedance means and a second output terminal, said second load impedance means and said second output terminal being connected to the collector of said second transistor;

a third transistor whose emitter is connected to the base of said second transistor by a first conducting means;

a fourth transistor whose emitter is connected to the base of said first transistor by a second conducting means;

first and second charge storage means connected respectively to the collectors of said third and fourth transistors for applying a common trigger signal to each of the collectors of said third and fourth transistors;

a third diode connected between the base of said third transistor and said first output terminal so that the direction of conduction is opposite to that of the emitter-base PN junction of said third transistor;

a fourth diode connected between the base of said fourth transistor and said second output terminal such that the direction of conduction is opposite to that of the emitter-base PN junction of said fourth transistor;

third impedance means connected to the base of said third transistor to give a prescribed electric potential to the base of said third transistor; and fourth impedance means connected to the base of said fourth transistor to give a prescribed electric potential to the base of said fourth transistor.

6. A flip-flop circuit according to claim 5, wherein said first to fourth transistors are NPN transistors.